(12) United States Patent
Tang

(10) Patent No.: US 9,226,429 B2
(45) Date of Patent: Dec. 29, 2015

(54) ELECTRONIC DEVICE WITH HEAT DISSIPATION APPARATUS

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventor: Xian-Xiu Tang, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 175 days.

(21) Appl. No.: 14/141,450

(22) Filed: Dec. 27, 2013

(65) Prior Publication Data

US 2015/0173250 A1    Jun. 18, 2015

(30) Foreign Application Priority Data

Dec. 13, 2013    (CN) .......................... 2013 1 0678094

(51) Int. Cl.
| | |
|---|---|
| *H05K 7/20* | (2006.01) |
| *G06F 1/20* | (2006.01) |
| *H05K 7/14* | (2006.01) |
| *G11B 33/14* | (2006.01) |

(52) U.S. Cl.
CPC .............. *H05K 7/20727* (2013.01); *G06F 1/20* (2013.01); *G11B 33/14* (2013.01); *H05K 7/1445* (2013.01); *H05K 7/1451* (2013.01); *H05K 7/20172* (2013.01); *H05K 7/20572* (2013.01)

(58) Field of Classification Search
CPC ..... H05K 7/20; H05K 7/1422; H05K 7/1445; H05K 7/1451; H05K 7/20572; H05K 7/20718; H05K 7/20145; H05K 7/20727; H05K 5/00; H05K 5/0026; G06F 1/20; G06F 1/203; G06F 1/206
USPC ............... 361/679.02, 679.33, 679.46–679.5, 361/690–695, 721–727, 736, 752, 788; 165/80.2, 80.3, 104.33, 121–126, 185; 174/15.1, 16.1, 50, 54, 59, 60, 520; 454/184; 312/223.1, 223.2, 223.3, 312/223.6, 330.1, 334.1, 334.5, 334.8

See application file for complete search history.

(56) References Cited

U.S. PATENT DOCUMENTS

| | | | | |
|---|---|---|---|---|
| 6,594,148 | B1 * | 7/2003 | Nguyen et al. | 361/695 |
| 6,909,603 | B2 * | 6/2005 | Wiley | 361/690 |
| 7,430,117 | B2 * | 9/2008 | Shabany | 361/695 |

(Continued)

*Primary Examiner* — Michail V Datskovskiy
(74) *Attorney, Agent, or Firm* — Novak Druce Connolly Bove + Quigg LLP

(57) ABSTRACT

An electronic device includes a server unit, a storage apparatus, and a heat dissipation apparatus. The server unit includes a bottom plate defining a first air inlet. The heat dissipation apparatus includes an exhaust fan located above the bottom plate and an air adjusting member. The exhaust fan includes a second air inlet aligning with the first air inlet. The adjusting member is slidably located between the first air inlet and the second air inlet. The bottom plate and the storage apparatus cooperatively bound an airflow channel communicating with the first air inlet. The second air inlet is partitioned into a first air inlet communicating with the airflow channel and a second air inlet communicating with the server unit by the air adjusting member. The air adjusting member is operated to slide to change sizes of the first air inlet and the second air inlet.

11 Claims, 5 Drawing Sheets

(56) References Cited

U.S. PATENT DOCUMENTS

| | | | |
|---|---|---|---|
| 7,791,894 B2 * | 9/2010 | Bechtolsheim | 361/752 |
| 7,859,839 B2 * | 12/2010 | Wada | 361/695 |
| 7,911,789 B2 * | 3/2011 | Sasagawa et al. | 361/695 |
| 8,089,754 B2 * | 1/2012 | Peng et al. | 361/679.48 |
| 8,811,020 B2 * | 8/2014 | Song et al. | 361/724 |
| 8,879,252 B2 * | 11/2014 | Kelaher et al. | 361/695 |
| 2004/0172642 A1 * | 9/2004 | Ding et al. | 720/649 |
| 2008/0310097 A1 * | 12/2008 | Sherrod et al. | 361/686 |

* cited by examiner

ELECTRONIC DEVICE WITH HEAT DISSIPATION APPARATUS

BACKGROUND

1. Technical Field

The present disclosure relates to electronic devices, and particularly to an electronic device comprising a heat dissipation apparatus.

2. Description of Related Art

Cabinet servers generally include a number of storage apparatuses and a number of server units. Each of the storage apparatuses includes a number of hard disk drives generating a great amount of heat during operation. Each server unit includes a number of components generating a great amount of heat during operation. The heat needs to be dissipated timely to ensure the proper functioning of the cabinet server. Presently, a number of fans are mounted to a rear side of the cabinet server for dissipating heat for the storage apparatuses and the server units. However, the airflow of the fans flowing through the storage apparatuses and the server units cannot be adjusted.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean "at least one".

Figure 1:
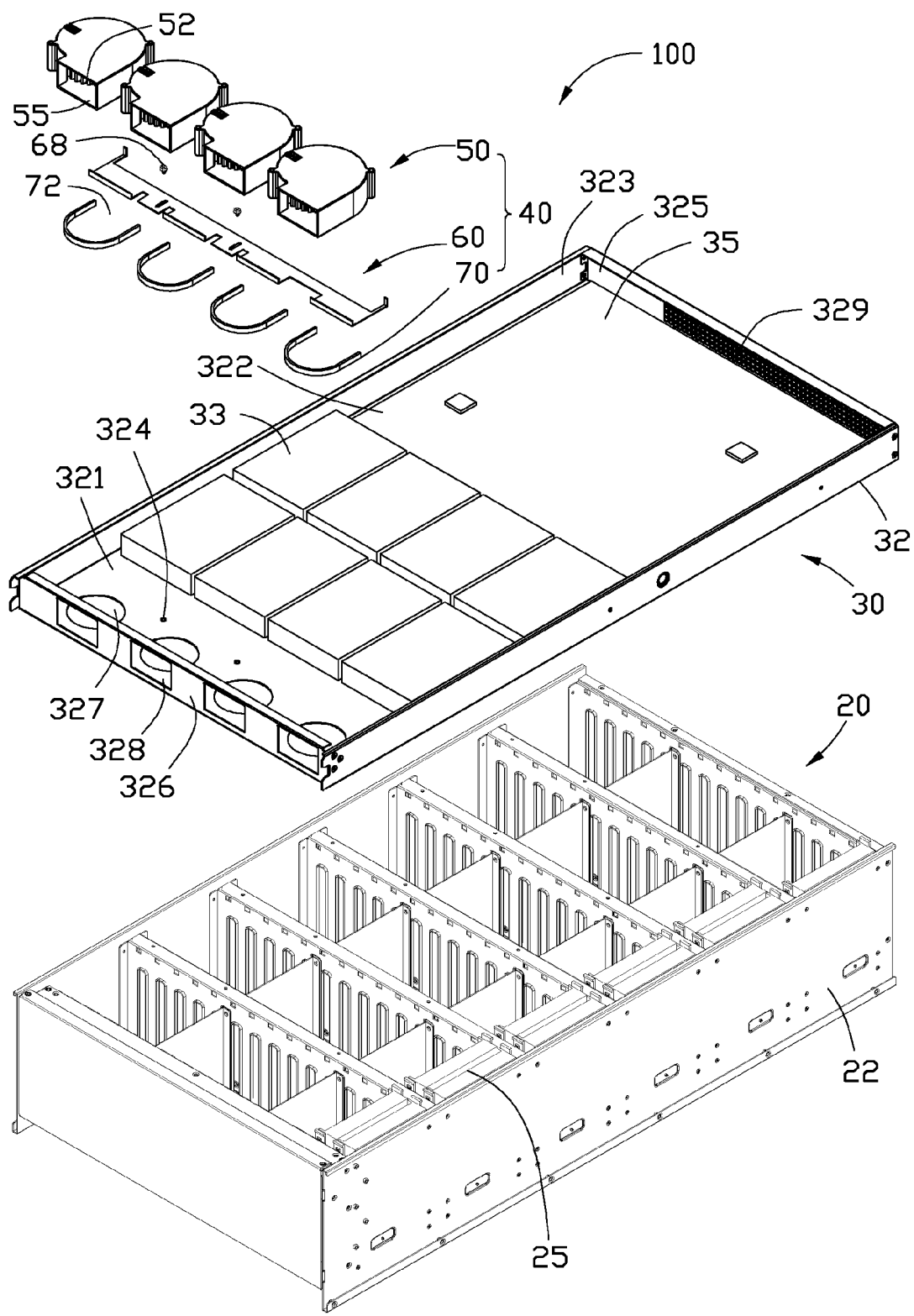
FIG. 1 is an exploded, isometric view of an embodiment of an electronic device, wherein the electronic device comprises an air adjusting member.

FIG. 1 shows an embodiment of an electronic device 100 comprising a storage apparatus 20, a server unit 30, and a heat dissipation apparatus 40. The heat dissipation apparatus 40 comprises a plurality of exhaust fans 50, an air adjusting member 60, and a plurality of U-shaped air partitioning bars 70.

The storage apparatus 20 comprises a rectangular shell 22 and a plurality of hard disk drives (HDD) 25 received in the shell 22.

The server unit 30 comprises a rectangular chassis 32, a plurality of hard disk drives (HDD) 33 received in the chassis 32, and a motherboard 35. The chassis 32 comprises a bottom plate 321, two side plates 323 perpendicularly extending up from two opposite sides of the bottom plate 321, a front end plate 325 extending up from a front end of the bottom plate 321 and connected between the side plates 323, and a rear end plate 326 extending up from a rear end of the bottom plate 321 and connected between the side plates 323. The bottom plate 321, the side plates 323, the front end plate 325, and the rear end plate 326 cooperatively bound a receiving space 322. The motherboard 35 is received in the receiving space 322, adjacent to the front end plate 325. The HDDs 33 are located on the bottom plate 321, adjacent to the rear end plate 326. The bottom plate 321 defines a row of air inlets 327 located between the rear end plate 236 and the HDDs 33. The air inlets 327 are arrayed along a lengthwise direction of the rear end plate 326. The bottom plate 321 defines two spaced mounting holes 324 adjacent to the air inlets 327 and between the inlets 327 and the HDDs 33. The rear end plate 326 defines a plurality of air outlets 328 arrayed along the lengthwise direction of the rear end plate 326. The front end plate 325 defines a plurality of vents 329.

Each exhaust fan 50 comprises an air inlet 52 and an air outlet 55.

Figure 2:
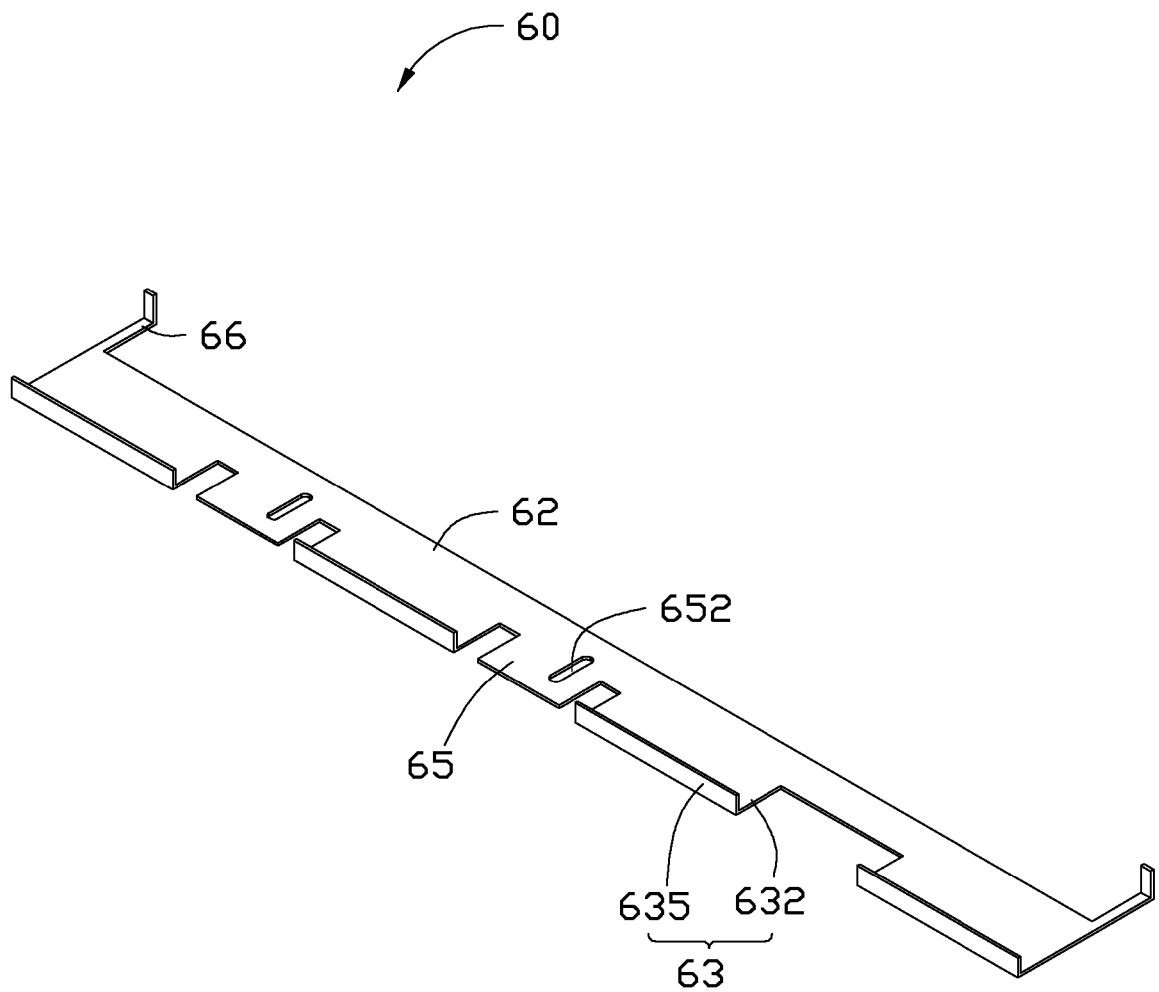
FIG. 2 is an enlarged view of the air adjusting member of FIG. 1.

Referring to FIG. 2, the air adjusting member 60 comprises a rectangular sliding plate 62, a plurality of spaced shielding plates 63 located at a first side of the sliding plate 62, two pieces 65 extending out from the first side of the sliding plate 62, and two L-shaped operation bars 66 located at a second side of the sliding plate 62 opposite to the shielding plates 63. Each shielding plate 63 comprises a first shielding portion 632 extending out from the first side of the sliding plate 62 and a second shielding portion 635 perpendicularly extending up from a side of the first shielding portion 632 opposite to the sliding plate 62. Each piece 65 defines a long slot 652 extending along a direction perpendicular to the lengthwise direction of the sliding plate 62.

Figure 3:
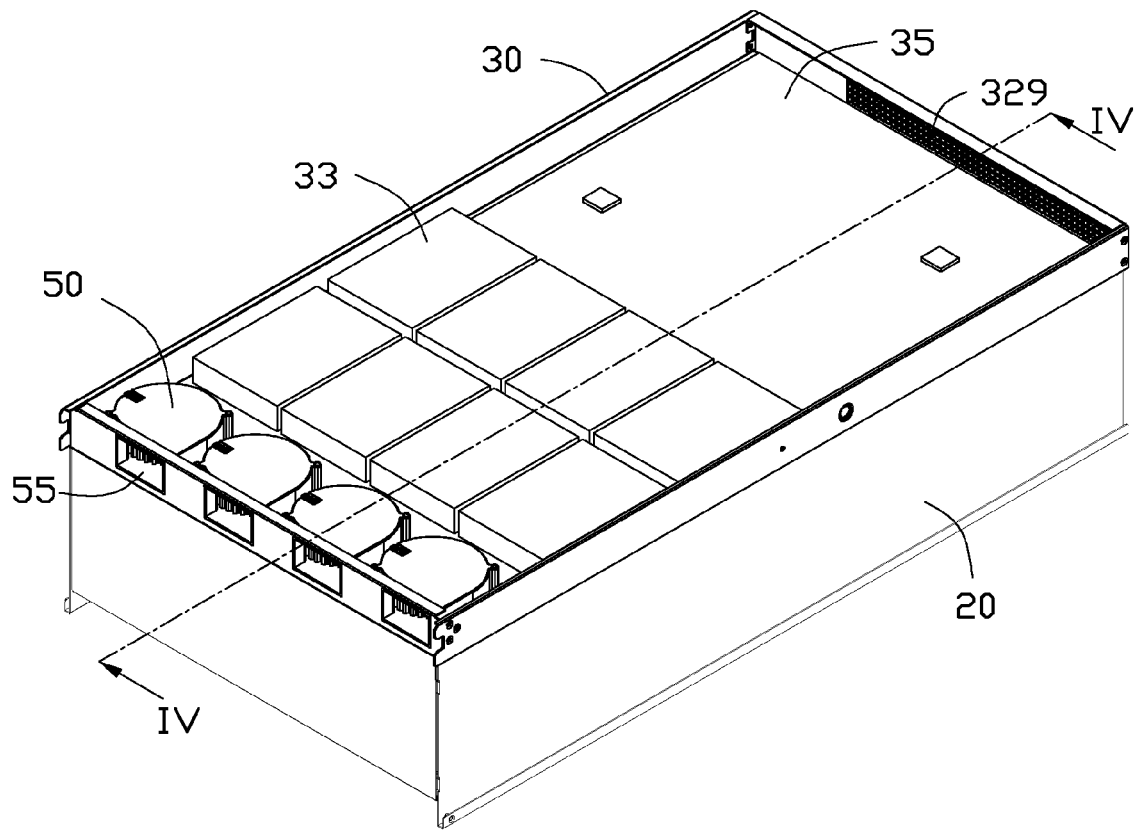
FIG. 3 is an assembled, isometric view of the electronic device of FIG. 1.
Figure 4:
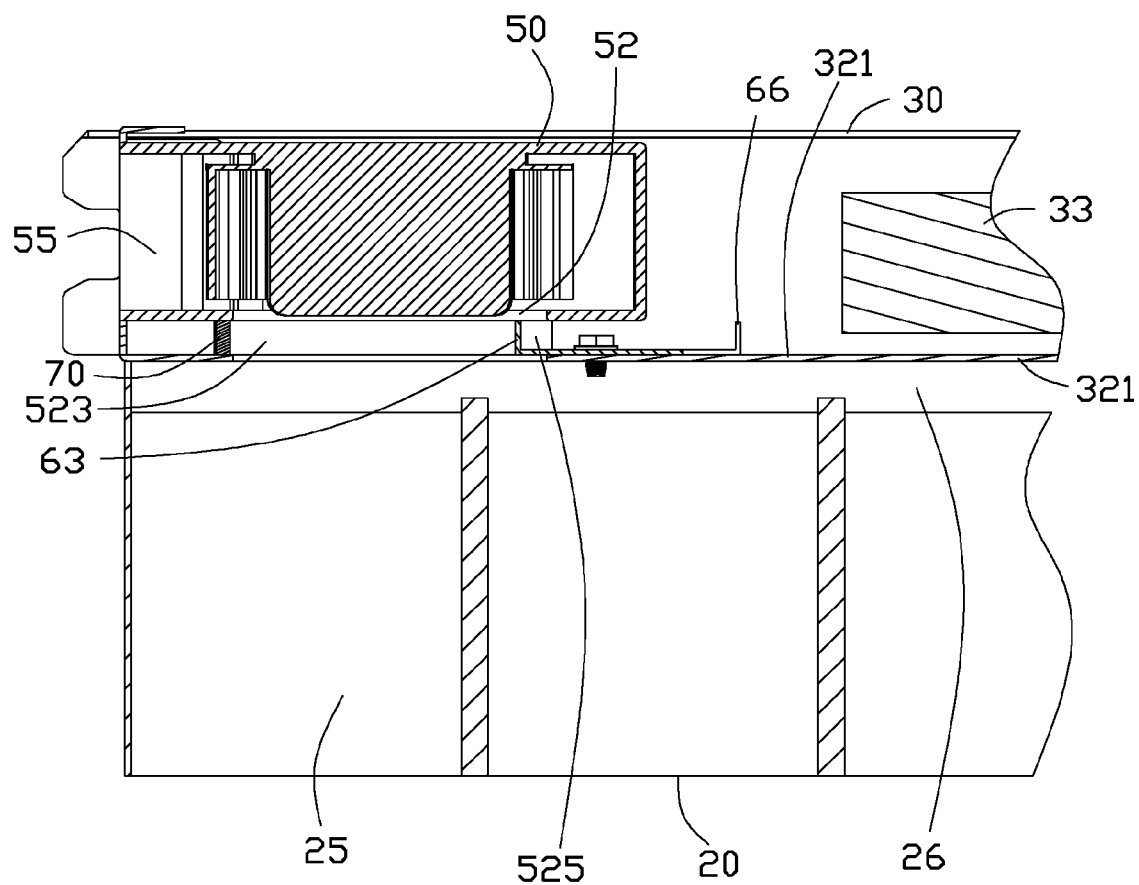
FIG. 4 is a cross-sectional view of FIG. 3, taken along the line of IV-IV.

FIGS. 3 and 4 show that the electronic device 100 in assembly, the air adjusting member 60 is received in the receiving space 327, and the sliding plate 62 is supported on the bottom plate 321. The shielding plates 63 align with the air inlets 327, and the slots 652 align with the mounting holes 324. Two fasteners 68 extend through the slots 652, to engage in the mounting holes 324. Each air inlet 327 is partially shielded by the corresponding first shielding portion 632. The air partitioning bars 70 are mounted on the bottom plate 321, to surround the corresponding air inlets 327, and the opening end 72 of each air portioning bar 70 faces the sliding plate 62. The shielding plates 63 are slidably received in the openings end 72 along the extending direction of the slots 652. The exhaust fans 50 are received in the receiving space 327, and located above the air partitioning bars 70. The air inlets 52 of the exhaust fans 50 align with the corresponding air inlets 327, and the air outlets 55 of the fans 50 align with the corresponding air outlets 328 of the chassis 32. The air partitioning bars 70 are sandwiched between the exhaust fans 50 and the bottom plate 321, and surround the air inlets 327 and 52.

The bottom plate 321 of the server unit 30 is covered on the shell 22. The bottom plate 321 and a top portion of the shell 22 cooperatively bound an airflow channel 26 communicating with the air inlets 327. The air inlet 52 of each exhaust fan 55 is partitioned into a first air inlet 523 communicating with the corresponding air inlet 327 and a second air inlet 525 communicating with the receiving space 322 by the corresponding shielding plate 63. The air adjusting member 60 is slid along the fasteners 68 to change the opening size of the first air inlet 523 and the second air inlet 525.

Figure 5:
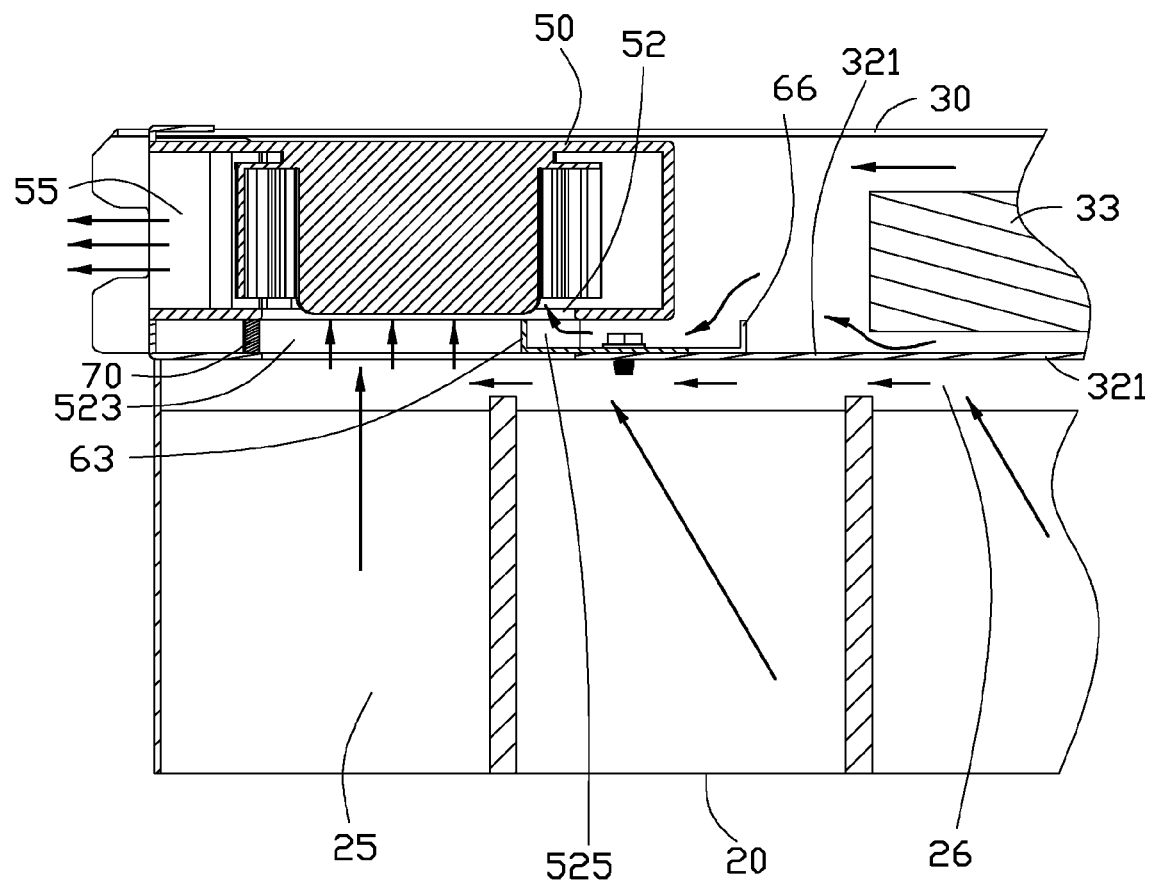
FIG. 5 is similar to FIG. 4, but shows the electronic device in a state of use.

FIG. 5 shows that the electronic device 100 in use. The motherboard 35 and the HDDs 33 generate heat transferred to the air of the receiving space 322, and the HDDs 25 generate heat transferred to the airflow channel 26. The exhaust fans 50 generate airflow, a first part of the airflow flows through the receiving space 322 and the second air inlets 525 to dissipate out of the server unit 30 through the air outlets 328, and a second part of the airflow flows through the airflow channel 26 and the first air inlets 523 to dissipate out of the storage apparatus 20 through the air outlets 328.

If the server unit 30 generates a great amount of heat. The fasteners 68 are loosened. The air adjusting member 60 is slid toward the rear end plate 326 by operating the operation bars 66, thereby increasing an opening size of the second air inlet 525, to increase the airflow of the exhaust fans 50 flowing through the receiving space 322. The fasteners 68 are then tightened.

If the storage apparatus 20 generates a great amount of heat. The fasteners 68 are loosened. The air adjusting member 60 is slid away from the rear end plate 326 by operating the operation bars 66, thereby increasing the opening size of the first air inlet 523, to increase the airflow of the exhaust fans 50 flowing through the airflow channel 26. The fasteners 68 are then tightened.

It is to be understood, that even though numerous characteristics and advantages of the embodiment have been set forth in the foregoing description, together with details of the structure and function of the embodiment, the disclosure is illustrative only, and changes may be made in detail, especially in the matters of shape, size, and arrangement of parts within the principles of the present disclosure to the full extent indicated by the broad general meaning of the terms in which the appended claims are expressed.

What is claimed is:

1. A heat dissipation apparatus for a storage device and a server unit located on the storage device, wherein the server unit comprises a bottom plate defining a first air inlet communicating with the storage device, the heat dissipation apparatus comprising:
   an exhaust fan installed above the bottom plate, and comprising a second air inlet aligning with the first air inlet of the bottom plate; and
   an air adjusting member slidably located on the bottom plate between the first air inlet of the bottom plate and the second air inlet of the exhaust fan, and partially shielding the first air inlet;
   wherein the second air inlet of the exhaust fan is partitioned into a first air inlet communicating with the storage apparatus and a second air inlet communicating with the server unit by the air adjusting member, the air adjusting member is operated to slide to change sizes of the first air inlet and the second air inlet.

2. The heat dissipation apparatus of claim 1, further comprising a U-shaped air partition bar located between the exhaust fan and the bottom plate, wherein the air partition bar surrounds the first and second air inlets, the air partition bar defines an opening facing the air adjusting member, the air adjusting member comprises a shielding plate slidably received in the opening, the second air inlet of the exhaust fan is partitioned into the first air inlet and the second air inlet by the shielding plate.

3. The heat dissipation apparatus of claim 2, wherein the air adjusting member further comprises a sliding plate slidably supported on the bottom plate, the shielding plate comprises a first shielding portion extending out from the bottom plate and a second shielding portion extending up from a side of the first shielding portion opposite to the sliding plate toward the second air inlet of the exhaust fan, the first shielding portion partially shields the first air inlet of the bottom plate.

4. The heat dissipation apparatus of claim 3, wherein the air adjusting member further comprises two pieces extending out from the sliding plate, each piece defines a long slot extending along a direction parallel to a sliding direction of the sliding plate, two fasteners slidably extend through the slots to engage in the bottom plate, the adjusting member is slidable along the fasteners.

5. The heat dissipation apparatus of claim 3, wherein the air adjusting member further comprises an operation bar extending out from the sliding plate.

6. An electronic device, comprising:
   a server unit comprising a bottom plate defining a first air inlet;
   a storage apparatus located below the bottom plate; and
   a heat dissipation apparatus comprising an exhaust fan located above the bottom plate and an air adjusting member;
   wherein the exhaust fan comprises a second air inlet aligning with the first air inlet of the bottom plate, the adjusting member is slidably located between the first air inlet of the bottom plate and the second air inlet of the exhaust fan, and partially shields the first air inlet; the bottom plate and the storage apparatus cooperatively bound an airflow channel communicating with the first air inlet, the second air inlet of the exhaust fan is partitioned into a first air inlet communicating with the airflow channel and a second air inlet communicating with the server unit by the air adjusting member, the air adjusting member is operable to slide to change sizes of the first air inlet and the second air inlet.

7. The electronic device of claim 6, wherein the server unit further comprises two side plates extending up from two opposite sides of the bottom plate, a front end plate located at a front end of the bottom plate, and a rear end plate located at a rear end of the bottom plate, the bottom plate, the side plates, the front end plate, and the rear end plate cooperatively bound a receiving space, the first air inlet is adjacent to the rear end plate, the front end plate defines a plurality of vents, the rear end plate defines a first air outlet, the exhaust fan further comprises a second air outlet aligning with the first air outlet of the rear end plate.

8. The electronic device of claim 6, wherein the heat dissipation apparatus further comprises a U-shaped air partition bar located between the exhaust fan and the bottom plate, the air partition bar surround the first and second air inlets, the air partition bar defines an opening facing the air adjusting member, the air adjusting member comprises a shielding plate slidably received in the opening, the second air inlet of the exhaust fan is partitioned into the first air inlet and the second air inlet by the shielding plate.

9. The electronic device of claim 8, wherein the air adjusting member further comprises a sliding plate slidably supported on the bottom plate, the shielding plate comprises a first shielding portion extending out from the bottom plate and a second shielding portion extending up from a side of the first shielding portion opposite to the sliding plate toward the second air inlet of the exhaust fan, the first shielding portion partially shields the first air inlet of the bottom plate.

10. The electronic device of claim 9, wherein the air adjusting member further comprises two pieces extending out from the sliding plate, each piece defines a long slot extending along a direction parallel to a sliding direction of the sliding plate, two fasteners extend through the slots and engage in the bottom plate, the adjusting member is slidable along the fasteners.

11. The electronic device of claim 9, wherein the air adjusting member comprises an operation bar extending out from the sliding plate.

* * * * *